(12) United States Patent
Thangaraju et al.

(10) Patent No.: US 9,245,790 B2
(45) Date of Patent: Jan. 26, 2016

(54) INTEGRATED CIRCUITS AND METHODS OF FORMING THE SAME WITH MULTIPLE EMBEDDED INTERCONNECT CONNECTION TO SAME THROUGH-SEMICONDUCTOR VIA

(71) Applicant: GLOBALFOUNDRIES, Inc., Grand Cayman, KY (US)

(72) Inventors: Sarasvathi Thangaraju, Malta, NY (US); Chun Yu Wong, Ballston Lake, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 355 days.

(21) Appl. No.: 13/747,579

(22) Filed: Jan. 23, 2013

(65) Prior Publication Data

US 2014/0203827 A1   Jul. 24, 2014

(51) Int. Cl.
*H01L 29/40* (2006.01)
*H01L 21/768* (2006.01)
*H01L 23/528* (2006.01)

(52) U.S. Cl.
CPC .... *H01L 21/76807* (2013.01); *H01L 21/76898* (2013.01); *H01L 23/528* (2013.01); *H01L 23/5286* (2013.01); *H01L 2924/0002* (2013.01)

(58) Field of Classification Search
CPC ....... G01R 27/14; H01L 23/48; H01L 21/768
USPC ............................ 257/621; 438/637; 324/713
See application file for complete search history.

(56) References Cited

U.S. PATENT DOCUMENTS

| | | | |
|---|---|---|---|
| 7,564,115 B2* | 7/2009 | Chen et al. | 257/508 |
| 8,143,726 B2* | 3/2012 | Knickerbocker et al. | 257/777 |
| 8,405,201 B2* | 3/2013 | Lin et al. | 257/698 |
| 8,610,270 B2* | 12/2013 | Lai et al. | 257/738 |
| 8,637,937 B2* | 1/2014 | Andry et al. | 257/382 |
| 8,754,533 B2* | 6/2014 | Or-Bach et al. | 257/777 |
| 2009/0140395 A1* | 6/2009 | Davis et al. | 257/621 |
| 2009/0191708 A1* | 7/2009 | Kropewnicki et al. | 438/667 |
| 2009/0224405 A1* | 9/2009 | Chiou et al. | 257/758 |
| 2010/0025825 A1* | 2/2010 | DeGraw et al. | 257/621 |
| 2010/0038800 A1* | 2/2010 | Yoon et al. | 257/774 |
| 2010/0164117 A1* | 7/2010 | Chen | 257/774 |
| 2010/0171197 A1* | 7/2010 | Chang et al. | 257/621 |
| 2010/0225002 A1* | 9/2010 | Law et al. | 257/774 |
| 2010/0244247 A1* | 9/2010 | Chang et al. | 257/741 |
| 2010/0252934 A1* | 10/2010 | Law et al. | 257/774 |

(Continued)

*Primary Examiner* — Caleb Henry
(74) *Attorney, Agent, or Firm* — Ingrassia Fisher & Lorenz, P.C.

(57) ABSTRACT

Integrated circuits, methods of forming integrated circuits, and methods of sensing voiding between a through-semiconductor via and a subsequent layer that overlies the through-semiconductor via in integrated circuits are provided. An exemplary method of forming an integrated circuit includes forming a plurality of semiconductor devices on a semiconductor substrate. A through-semiconductor via is formed in the semiconductor substrate, and an interlayer dielectric layer is formed that overlies the through-semiconductor via and the plurality of semiconductor devices. A first interconnect via is embedded within the interlayer dielectric layer, and a second interconnect via is embedded within the interlayer dielectric layer. The first interconnect via and the second interconnect via are in electrical communication with the through-semiconductor via at spaced locations from each other on the through-semiconductor via.

8 Claims, 6 Drawing Sheets

(56) References Cited

U.S. PATENT DOCUMENTS

| | | | |
|---|---|---|---|
| 2011/0081749 A1* | 4/2011 | Chiou et al. | 438/121 |
| 2011/0227227 A1* | 9/2011 | West | 257/757 |
| 2011/0227230 A1* | 9/2011 | Gu et al. | 257/773 |
| 2011/0241217 A1* | 10/2011 | Chang et al. | 257/774 |
| 2012/0007154 A1* | 1/2012 | Lin et al. | 257/288 |
| 2012/0267788 A1* | 10/2012 | Hong et al. | 257/774 |
| 2012/0270391 A1* | 10/2012 | Zengxiang et al. | 438/653 |
| 2012/0273955 A1* | 11/2012 | Or-Bach et al. | 257/762 |
| 2012/0288083 A1* | 11/2012 | Sun et al. | 379/395 |
| 2012/0326309 A1* | 12/2012 | Andry et al. | 257/741 |
| 2013/0001783 A1* | 1/2013 | Yu et al. | 257/751 |
| 2013/0009317 A1* | 1/2013 | Hsieh et al. | 257/774 |
| 2013/0093098 A1* | 4/2013 | Yang et al. | 257/774 |
| 2013/0113068 A1* | 5/2013 | Ramachandran et al. | 257/506 |
| 2013/0140690 A1* | 6/2013 | Lin et al. | 257/737 |
| 2013/0181330 A1* | 7/2013 | Ramachandran et al. | 257/621 |
| 2013/0221494 A1* | 8/2013 | Ramachandran et al. | 257/621 |
| 2013/0285125 A1* | 10/2013 | Chen et al. | 257/288 |
| 2013/0334669 A1* | 12/2013 | Kuo et al. | 257/621 |
| 2013/0334699 A1* | 12/2013 | Kuo et al. | 257/774 |
| 2013/0341799 A1* | 12/2013 | Chen et al. | 257/774 |
| 2014/0008757 A1* | 1/2014 | Ramachandran et al. | 257/506 |
| 2014/0021612 A1* | 1/2014 | Huang et al. | 257/751 |
| 2014/0035155 A1* | 2/2014 | Tan et al. | 257/774 |
| 2014/0061940 A1* | 3/2014 | Kitao et al. | 257/774 |
| 2014/0084476 A1* | 3/2014 | Lin et al. | 257/774 |
| 2014/0117461 A1* | 5/2014 | Chen et al. | 257/401 |
| 2014/0131884 A1* | 5/2014 | Lin et al. | 257/774 |
| 2014/0175651 A1* | 6/2014 | Pelto et al. | 257/751 |
| 2014/0203412 A1* | 7/2014 | Wang et al. | 257/621 |
| 2014/0264630 A1* | 9/2014 | Huang et al. | 257/401 |
| 2014/0264733 A1* | 9/2014 | Yuan et al. | 257/531 |
| 2014/0264911 A1* | 9/2014 | Lin et al. | 257/774 |
| 2014/0264917 A1* | 9/2014 | Huang et al. | 257/774 |
| 2014/0273435 A1* | 9/2014 | Huang et al. | 438/653 |

\* cited by examiner

INTEGRATED CIRCUITS AND METHODS OF FORMING THE SAME WITH MULTIPLE EMBEDDED INTERCONNECT CONNECTION TO SAME THROUGH-SEMICONDUCTOR VIA

TECHNICAL FIELD

The present invention generally relates to integrated circuits and methods of forming integrated circuits, and more particularly relates to integrated circuits and methods of forming integrated circuits with embedded interconnect vias disposed in an interlayer dielectric layer and in electrical communication to a through-semiconductor via.

BACKGROUND

During a front end-of-the-line (FEOL) semiconductor fabrication process, a plurality of semiconductor devices (e.g., transistors, resistors, and the like) is generally formed on a semiconductor substrate. During a back end-of-the-line (BEOL) semiconductor fabrication process, the semiconductor devices are connected by a network of electrically-conductive lines, vias, and interconnect structures. The network of electrically-conductive lines, vias, and interconnect structures selectively connect the semiconductor devices to each other and to various other devices such as, but not limited to, a power source, clocks, signals, addresses, and input and output sources, and also connect the semiconductor devices to subsequently-formed semiconductor devices. In this manner, a plurality of integrated circuits (ICs) is formed on the semiconductor substrate with electrical connection enabled through the network of electrically-conductive lines, vias, and interconnect structures.

To enable efficient interconnection of the semiconductor devices to each other and to a power source, electrically-conductive vias are integrally formed within the semiconductor substrate and extend across various levels of integrated circuits to provide power to the different levels. Such electrically-conductive vias are known in the art as through-semiconductor vias. The through-semiconductor vias are formed during the BEOL semiconductor fabrication process by selectively etching a recess through any dielectric layers that overlie the semiconductor substrate and at least partially into the semiconductor substrate, followed by depositing metal such as copper in the recess and chemical-mechanical planarization (CMP) to remove excess metal from outside of the recess. Subsequent layers are then formed over the dielectric layers and the through-semiconductor via, including a metal layer that selectively connects the through-semiconductor vias to a power source and to the semiconductor devices.

Void formation is a common problem associated with forming subsequent layers over the through-semiconductor via. Without being bound to any particular theory, it is believed that void formation is attributable to migration of metal ions from the through-semiconductor vias into the interface between the through-semiconductor vias and the metal layer or dielectric layers that overlie the through-semiconductor vias. It is believed that the migration of the metal ions causes stress-induced warping in the subsequent layers, thereby creating voids between the through-semiconductor vias and the metal layer that overlies the through-semiconductor vias. As a result of void formation, connections between the through-semiconductor vias and the subsequent layers may be compromised at various locations, resulting in loss of electrical communication between the through-semiconductor vias and the subsequent metal layer that overlies the through-semiconductor vias.

In addition to void formation between through-semiconductor vias and subsequent layers being a common problem, sensing and assessing void formation between through-semiconductor vias and subsequent layers is also difficult. Subsequent layers that overlie the through-semiconductor vias generally include metal lines that extend over a surface of the through-semiconductor via and a number of conductive layers that are electrically connected to the through-semiconductor vias and the metal lines. Successful connection between the metal lines and the through-semiconductor via can be sensed based upon whether electrical current flows between the metal lines and the through-semiconductor via. However, such connection fails to provide a useful mechanism for sensing void formation because the electrical current will still flow between the metal lines and the through-semiconductor vias so long as a void does not completely block a connection between the metal lines and the through-semiconductor vias, and the presence of the void may cause premature device failure.

Accordingly, it is desirable to provide integrated circuits and methods of forming integrated circuits that minimize or alleviate void formation between through-semiconductor vias and subsequent layers that overlie the through-semiconductor vias. It is also desirable to provide methods of sensing voiding between through-semiconductor vias and a subsequent layer that overlie the through-semiconductor vias in an integrated circuit. Furthermore, other desirable features and characteristics of the present invention will become apparent from the subsequent detailed description of the invention and the appended claims, taken in conjunction with the accompanying drawings and this background of the invention.

BRIEF SUMMARY

Integrated circuits, methods of forming integrated circuits, and methods of sensing voiding between a through-semiconductor via and a subsequent layer that overlies the through-semiconductor via in integrated circuits are provided herein. In an embodiment, a method of forming an integrated circuit includes forming a plurality of semiconductor devices on a semiconductor substrate. A through-semiconductor via is formed in the semiconductor substrate, and an interlayer dielectric layer is formed that overlies the through-semiconductor via and the plurality of semiconductor devices. A first interconnect via is embedded within the interlayer dielectric layer, and a second interconnect via is embedded within the interlayer dielectric layer. The first interconnect via and the second interconnect via are in electrical communication with the through-semiconductor via at spaced locations from each other on the through-semiconductor via.

In another embodiment, a method of sensing voiding between a through-semiconductor via and a subsequent layer that overlies the through-semiconductor via in an integrated circuit includes providing the integrated circuit that includes a plurality of semiconductor devices disposed on a semiconductor substrate. A through-semiconductor via is disposed in the semiconductor substrate of the integrated circuit, and an interlayer dielectric layer overlies the through-semiconductor via and the plurality of semiconductor devices. A first interconnect via is embedded within the interlayer dielectric layer, and a second interconnect via is embedded within the interlayer dielectric layer. The first interconnect via and the second interconnect via are in electrical communication with the through-semiconductor vias at spaced locations from each other on the through-semiconductor via to form an electrical connection. An electrical current is passed through the electrical connection between the first interconnect via and the second interconnect via, through the through-semiconductor via. Electrical resistance to passage of the electrical current in the electrical connection is measured between the first interconnect via and the second interconnect via to enable voiding to be sensed.

In another embodiment, an integrated circuit includes a semiconductor substrate and a plurality of semiconductor devices disposed on the semiconductor substrate. A through-semiconductor via is disposed in the semiconductor substrate and an interlayer dielectric layer overlies the through-semiconductor via and the plurality of semiconductor devices. A first interconnect via is embedded within the interlayer dielectric layer, and a second interconnect via is embedded within the interlayer dielectric layer. The first interconnect via and the second interconnect via are in electrical communication with the through-semiconductor vias at spaced locations from each other on the through-semiconductor via.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Integrated circuits, methods of forming integrated circuits, and methods of sensing voiding between a through-semiconductor via and a subsequent layer that overlies the through-semiconductor via in integrated circuits are provided herein. The integrated circuits include a semiconductor substrate having a plurality of semiconductor devices formed thereon, with a through-semiconductor via formed in the semiconductor substrate for supplying electricity through various layers of the integrated circuit. An interlayer dielectric layer is formed that overlies the through-semiconductor via and the plurality of semiconductor devices. A first interconnect via is embedded within the interlayer dielectric layer, and a second interconnect via is embedded within the interlayer dielectric layer with the first interconnect via and the second interconnect via in electrical communication with the through-semiconductor vias. The first interconnect via and the second interconnect via are embedded in the interlayer dielectric layer at spaced locations from each other on the through-semiconductor via. By providing the first interconnect via and the second interconnect via, difficulties with electrical connection to the through-semiconductor via with a single metal line are avoided. In particular, electrical connection to the through-semiconductor via with a single metal line is prone to void formation between the single metal line and the through-semiconductor via, whereas the first interconnect via and the second interconnect via each have a lesser contact area than traditional electrical connections to the through-semiconductor via with a single metal line. In this manner, impact of void formation can be minimized while maintaining substantially uniform electrical contact between the first interconnect via and the second interconnect via across the through-semiconductor via. Further, by providing the first interconnect via and the second interconnect via, voiding between through-semiconductor via and a subsequent layer that overlies the through-semiconductor via can be measured by passing electrical current between the first interconnect via and the second interconnect via, through the through-semiconductor via, and by measuring resistivity. Thus, to the extent that any void formation occurs and impacts operation of the integrated circuit, such impact can be readily determined in the integrated circuits described herein, with appropriate fabrication modifications implemented to address specific problems with void formation.

Figure 1:
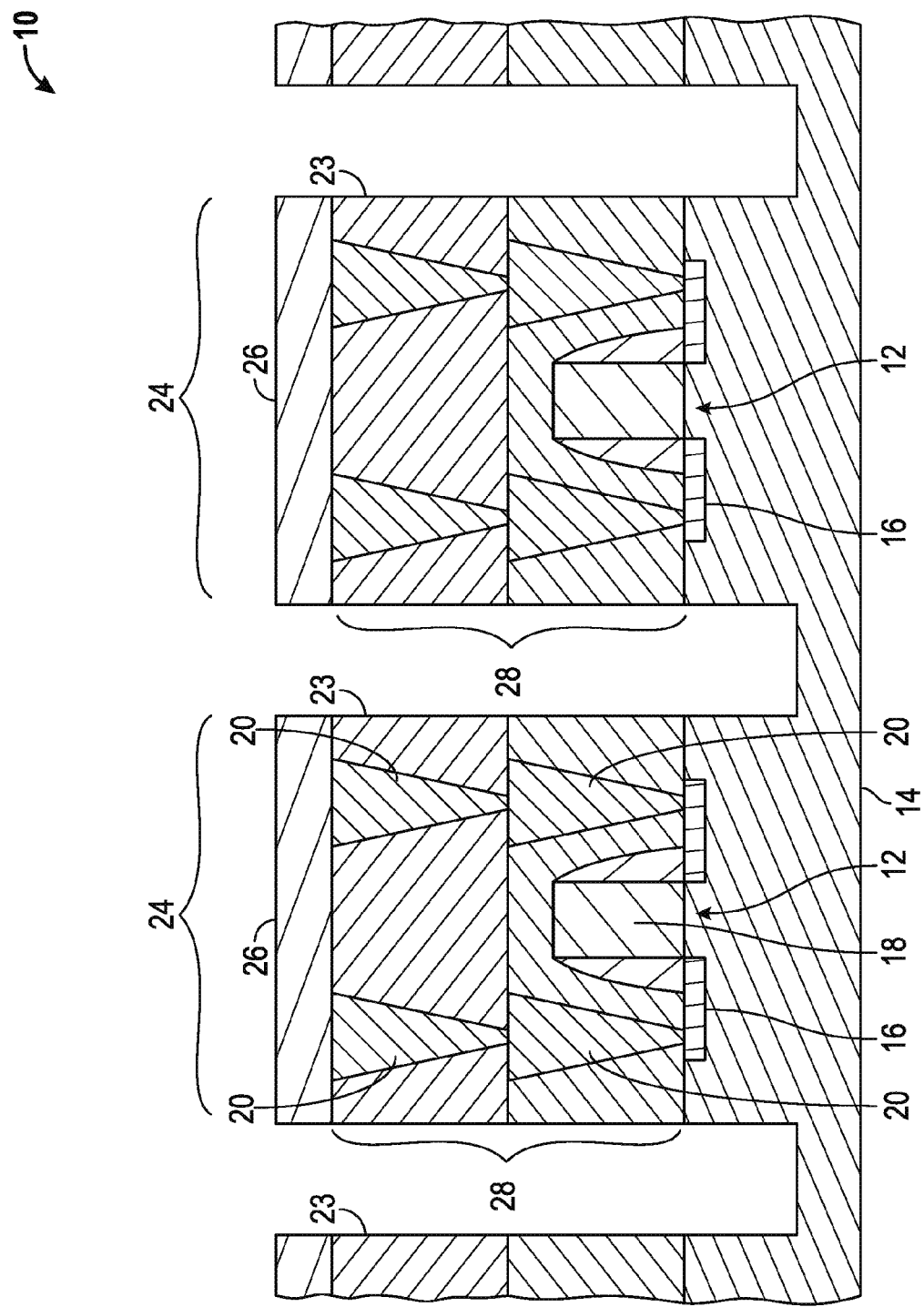
FIG. 1 is a schematic cross-sectional side view of a portion of an integrated circuit including a semiconductor substrate and transistors formed on the semiconductor substrate, with via holes for through-semiconductor vias formed in the integrated circuit.
Figure 3:
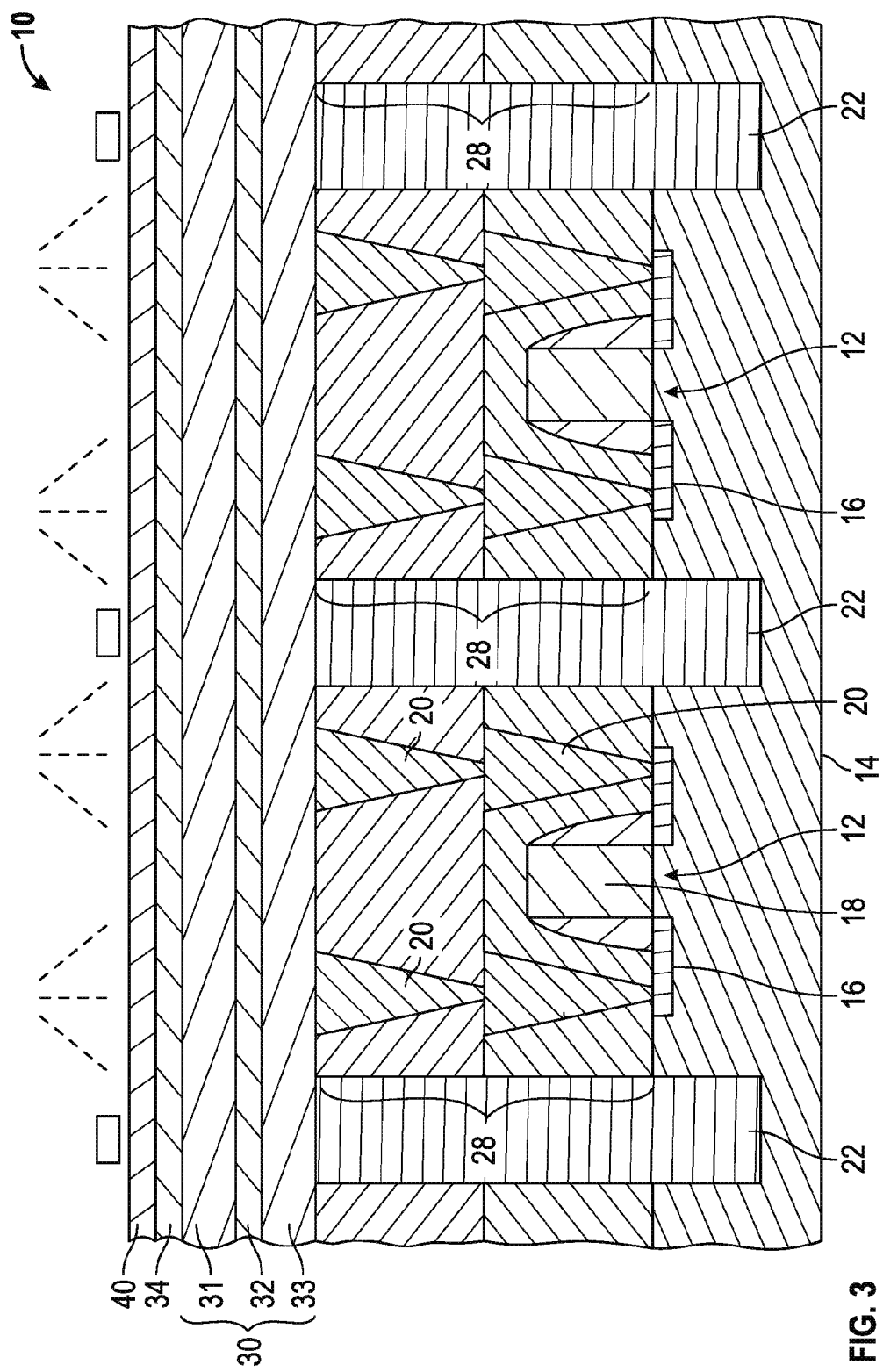
FIG. 3 is a schematic cross-sectional side view of the portion of the integrated circuit as shown in FIG. 2, with an interlayer dielectric layer formed that overlies the through-semiconductor vias and the transistors, illustrating printing of a resist film over the interlayer dielectric layer.
Figure 4:
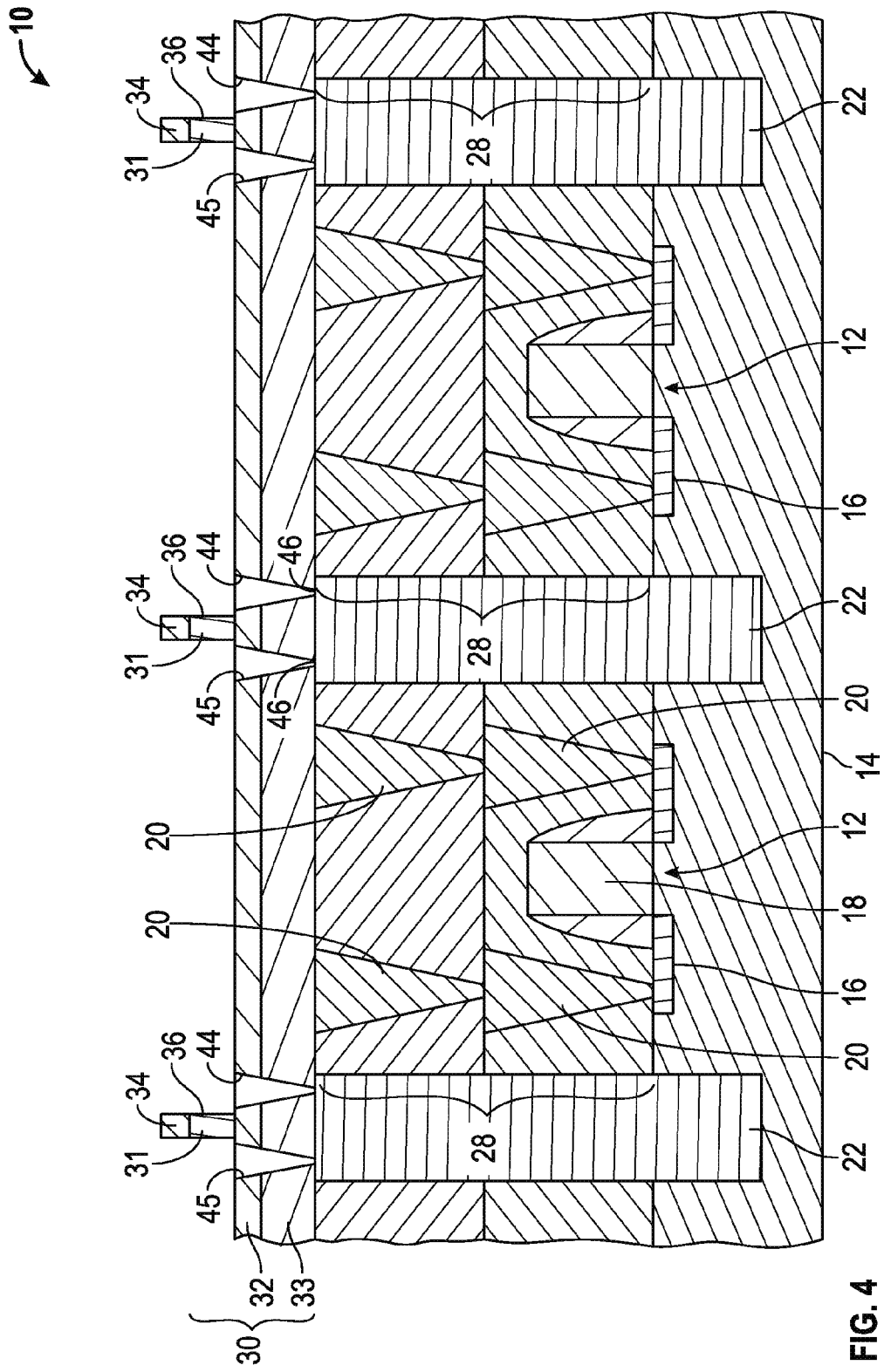
FIG. 4 is a schematic cross-sectional side view of the portion of the integrated circuit as shown in FIG. 3, illustrating etching of the interlayer dielectric layer to form a pattern in the interlayer dielectric layer through gaps in the resist film.
Figure 5:
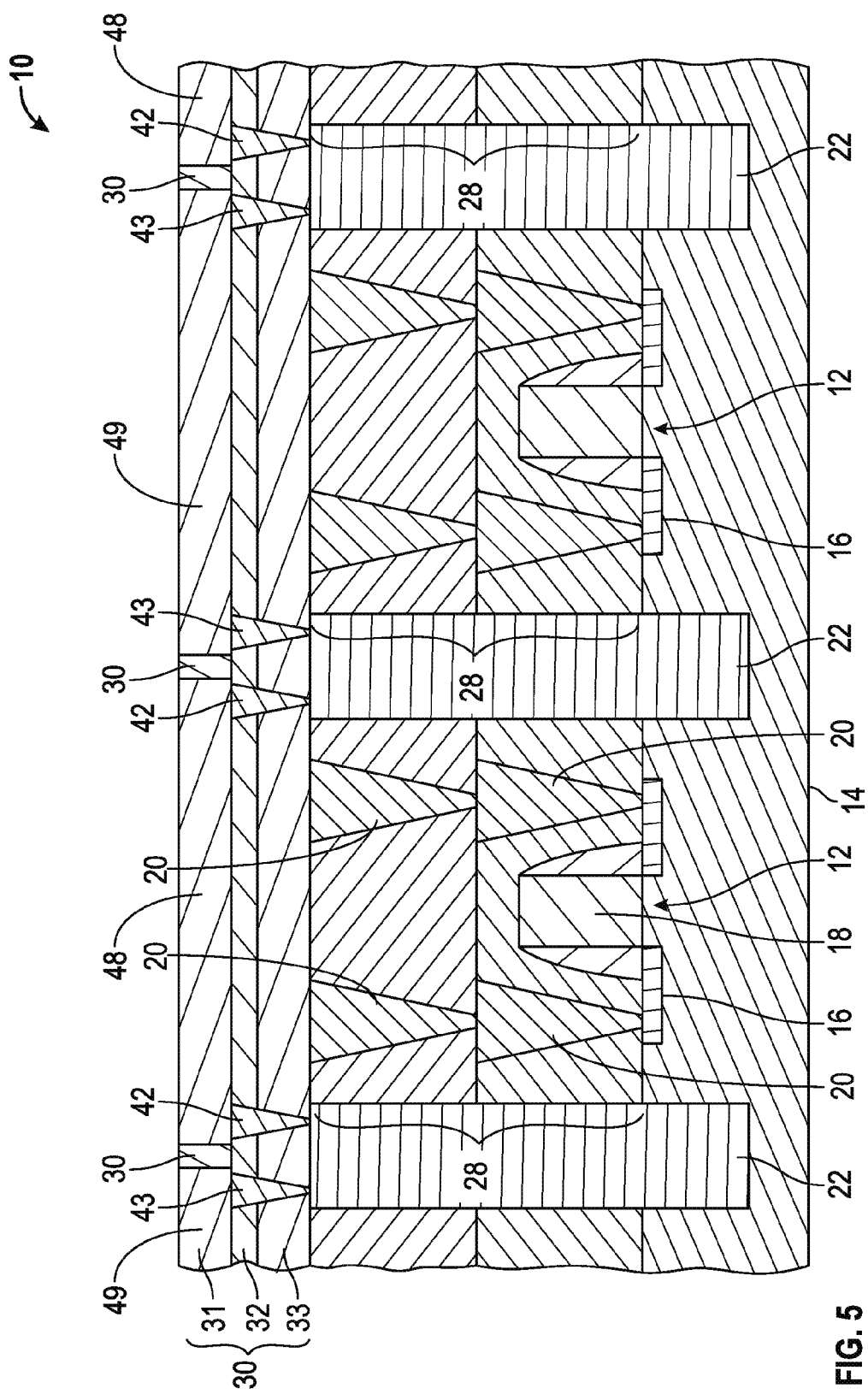
FIG. 5 is a schematic cross-sectional side view of the portion of the integrated circuit as shown in FIG. 4 after filling the pattern and interconnect holes with electrically-conductive material to form a first metal layer and interconnect vias, respectively.

Referring to FIGS. 1-5, an embodiment of an integrated circuit 10 and a method of forming the integrated circuit 10 will now be described, with FIG. 5 showing the integrated circuit 10 that is formed in accordance with the method as shown sequentially in FIGS. 1-4. Referring now to FIG. 1, a plurality of semiconductor devices 12 are formed on a semiconductor substrate 14, and the semiconductor devices 12 are present in the resulting integrated circuit 10 as shown in FIG. 5. The semiconductor substrate 14, as referred to herein, includes semiconductor material such as any group IV semiconductor material. Examples of suitable semiconductor materials include, but are not limited to, those chosen from silicon, silicon germanium (SiGe), germanium (Ge), gallium arsenide (GaAs), or indium phosphide (InP). For example, in an embodiment, the semiconductor material is a silicon-containing material, such as mono- or poly-crystalline silicon, and the semiconductor substrate 14 may contain one or more doped regions 16 of the silicon-containing material. In FIG. 1, the semiconductor substrate 14 is shown as a base substrate with no further structure beneath the semiconductor substrate 14; however, although not shown, it is to be appreciated that the semiconductor substrate 14 can be an intermediate substrate within a stack of alternating layers produced through front-end-of-line (FEOL) fabrication and back-end-of-line (BEOL) fabrication techniques to form the integrated circuit 10. The semiconductor devices 12 include, but are not limited to, transistors, capacitors, resistors, or the like. In an embodiment, the semiconductor devices 12 are transistors that include a gate electrode 18 with embedded electrical contacts 20 that provide electrical connections on opposite sides of the gate electrode 18. A dielectric layer 28 is formed that overlies the semiconductor substrate 14, gate electrode 18, and the embedded electrical contacts 20 are formed in the dielectric layer 28 through techniques known in the art.

Figure 2:
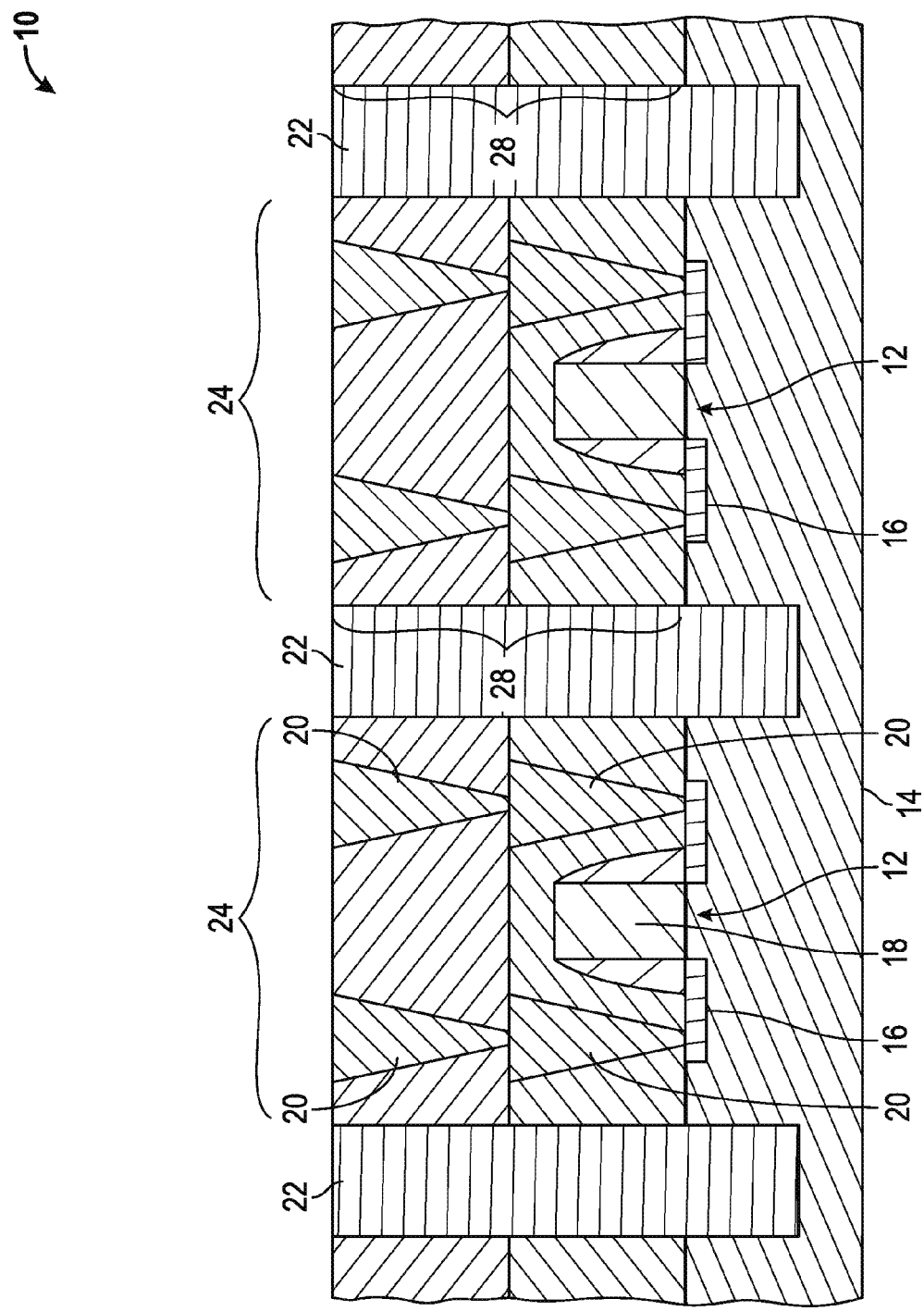
FIG. 2 is a schematic cross-sectional side view of the portion of the integrated circuit as shown in FIG. 1, with through-semiconductor vias formed in the via holes.

As shown in FIG. 2, a through-semiconductor via 22 is formed in the semiconductor substrate 14, with the through-semiconductor via 22 disposed in the semiconductor substrate 14 of the resulting integrated circuit 10 as shown in FIG. 5. In an embodiment and as shown in FIG. 2, a plurality of the through-semiconductor vias 22 is formed in the semiconductor substrate 14 with the semiconductor substrate 14 surrounding the through-semiconductor vias 22, with regions 24 of the semiconductor substrate 14 that are adjacent to the through-semiconductor vias 22 having at least one semiconductor device 12 formed thereon. The through-semiconductor vias 22 at least partially extend into the semiconductor substrate 14, and generally extend completely through the semiconductor substrate 14, to clearly define the regions 24 of the semiconductor substrate 14 that are adjacent to the through-semiconductor vias 22. As such, it is to be appreciated that "through-semiconductor", as the phase is used herein, does not necessarily require that the through-semiconductor via 22 extends completely through the semiconductor substrate 14.

The through-semiconductor via 22 includes an electrically-conductive material such as, but not limited to, metals including copper, tungsten, aluminum, silver, gold, other metals, or alloys thereof. The through-semiconductor via 22 enables semiconductor devices 12 in different levels of the integrated circuit 10 to be connected to a power source (not shown) and to other devices within the integrated circuit 10, with the through-semiconductor via 22 embedded directly within the integrated circuit 10 to provide a common line that passes through various layers of the integrated circuit 10. The through-semiconductor via 22 enables the integrated circuits 10 to be scaled down without sacrificing robust electrical connections between the semiconductor devices 12 and the power source, and further provides manufacturing efficiencies by avoiding the need for separate wiring schemes to be implemented after forming the integrated circuits 10.

In an embodiment, the through-semiconductor via 22 is formed by etching a via hole 23 into the semiconductor substrate 14, including through any dielectric layers 28 that overlie the semiconductor devices 12, to form the regions 24 of the semiconductor substrate 14 on either side of the via hole 23. In an embodiment and as shown in FIG. 1, a protecting layer 26 of dielectric material is formed over dielectric layers 28 that overlie the semiconductor devices 12, with the protecting layer 26 including dielectric material that has a materially different etch rate in particular etchants than the dielectric layer 28 that is immediately beneath the protecting layer 26. By "materially different", it is meant that an etchant and etching technique that is effective to etch one of the layers etches another of the layers at a rate that is measurably slower, such as at least 50 percent slower. The protecting layer 26 thus functions as a hard mask, whereby the protecting layer 26 is patterned with the pattern in the protecting layer 26 transferred to underlying dielectric layers 28. In further detail, known techniques can be employed that utilize printing to pattern a resist film (not shown) over the protecting layer 26, with the resist film patterned with a desired configuration of the via hole 23, followed by etching the protecting layer 26 through the pattern in the resist film with an appropriate etchant that preferentially etches the protecting layer 26 to transfer the pattern in the resist film into the protecting layer 26. Once the pattern is transferred into the protecting layer 26, an appropriate etchant is employed to etch the dielectric layers 28 that overlie the semiconductor devices 12 through the pattern in the protecting layer 26. In one example, the protecting layer 26 includes a nitrogen-containing silicon material such as nitrogen-doped silicon carbide or Si—N—C—H (NBLoK), and the dielectric layer 28 that is immediately beneath the protecting layer 26 includes an oxide such as silicon dioxide, with known etchants employed for etching that preferentially etch the nitrogen-containing silicon material and the oxide. Suitable etchants for nitrogen-containing silicon material include, but are not limited to, $CHF_3/O_2$ mixtures, and etching of the protecting layer 26 can be conducted through dry etching techniques. Examples of suitable oxide etchants include, but are not limited to, $CHF_3$, $CF_4$, or $SF_6$. Although particular etching techniques are not limited, the oxide may be etched through dry etching techniques, also referred to in the art as plasma etching techniques. The semiconductor substrate 14 may then be etched to form the at least one via hole 23 through known etching techniques, such as isotropic etching using SF6 and C4F8. It is to be appreciated that various configurations of dielectric layers 28 that overlie the semiconductor devices 12 can be employed, and various materials can be used for the protecting layer 26 and the dielectric layer 28 that overlies the semiconductor devices 12, with differences in etch rates between the materials exploited to preferentially etch the via holes in a uniform manner. As referred to herein, the term "dielectric layer" encompasses one or more individual dielectric layers that overlie the semiconductor devices 12. For example, although two individual layers are shown in the dielectric layer 28 that overlies the semiconductor devices 12, it is to be appreciated that the dielectric layer 28 may include a single layer (not shown). Alternatively, more than two individual layers can be present in the dielectric layer 28 in other embodiments, depending upon particular architecture of the semiconductor devices 12 and electrical connections to the semiconductor devices 12.

Referring to FIG. 2, the through-semiconductor via 22 is formed in the via hole in the semiconductor substrate 14, such as through deposition of electrically-conductive material in the via hole while the protecting layer is still in place followed by chemical-mechanical planarization (CMP) of the protecting layer and excess electrically-conductive material that is outside of the via hole. The protecting layer and excess electrically-conductive material that is outside of the via hole are removed through CMP, thereby leaving the structure as shown in FIG. 2.

Referring to FIG. 3, after forming the through-semiconductor via 22 in the semiconductor substrate 14, an interlayer dielectric layer 30 is formed that overlies the through-semiconductor via 22 and the plurality of semiconductor devices 12. More particularly, the interlayer dielectric layer 30 is formed overlying the through-semiconductor via 22 and any dielectric layers 28 that overlie the semiconductor devices 12 and that remain after forming the through-semiconductor via 22 (i.e., dielectric layers 28 that are formed during the FEOL fabrication). For purposes of the instant application, the "interlayer dielectric layer" refers to a layer or layers of dielectric material that are formed during BEOL fabrication and that at least partially remain in the integrated circuit 10 after fabrication. It is to be appreciated that separate layers 31, 32, 33 of different dielectric material can be present in the structure referred to herein as the "interlayer dielectric layer", or the interlayer dielectric layer 30 can include only a single layer (not shown). For example in an embodiment, as shown in FIG. 3, the interlayer dielectric layer 30 includes a combination of separate layers 31, 32, 33 that include different dielectric materials that have materially different etch rates in different etchants for purposes of selectively etching the interlayer dielectric layer 30 in the same manner as described above in the context of forming the through-semiconductor via 22. It is also to be appreciated that, during fabrication, additional layers of dielectric material may be formed that are subsequently completely removed during fabrication, such as a hard mask 34 that is described in further detail below, and such additional layers are not encompassed by the "interlayer dielectric layer" as referred to herein if such layers are ultimately removed from the integrated circuit 10. It is also to be appreciated that, although not shown, one or more additional layers may also be present in layer 30, including dielectric layers and/or metal layers, and the structure shown in the Figures for the interlayer dielectric layer is not limited to only the layers 31, 32, 33 that are explicitly shown.

In accordance with an embodiment, after the interlayer dielectric layer 30 is formed, printing and etching are employed to pattern the interlayer dielectric layer 30. In an embodiment, a pattern is formed in the interlayer dielectric layer 30 in the same manner as described above for forming the through-semiconductor via 22, where the protecting layer is employed and is patterned using printing of a resist film. In particular, in accordance with an embodiment and as shown in FIG. 3, a resist film 40 is formed over the interlayer dielectric layer 30 and patterned through printing. Although not shown, a pattern in the resist film 40 is transferred to a hard mask 34, which is comparable to the protecting layer as described above. As shown in FIG. 4, a pattern 36 is then etched in the interlayer dielectric layer 30 over the through-semiconductor via 22 or the plurality of the through-semiconductor vias 22, through the pattern 36 in the hard mask 34, to transfer the pattern 36 into the interlayer dielectric layer 30. Portions of the hard mask 34 that remain after etching are generally shown in FIG. 4. In an embodiment, material of the hard mask 34 is substantially resistant to etchants that are effective for etching the interlayer dielectric layer 30, or an individual layer 31 thereof that is immediately beneath the hard mask 34, and the hard mask 34 is not completely removed during etching of the interlayer dielectric layer 30 such that the hard mask 34 is effective for maintaining the shape of the pattern 36 during etching of the interlayer dielectric layer 30. In an embodiment, the hard mask 34 includes metal, although it is to be appreciated that other known materials for hard masks can also be used and the hard masks described herein are not limited to any particular material. However, it is to be appreciated that suitable integration schemes are not limited to the preceding examples.

As set forth above, the interlayer dielectric layer 30 may include separate layers 31, 32, 33 including different materials that have different etch rates in different etchants, and selection of particular materials can be employed to control etching of the interlayer dielectric layer 30. For example, in an embodiment and as shown in FIG. 4, one of the separate layers 31, 32, 33 included in the interlayer dielectric layer 30 is an etch stop layer 32, which may be employed to isolate etching of the pattern 36 to a particular depth within the interlayer dielectric layer 30. In this embodiment, the etch stop layer 32 includes a material, such as a nitrogen-containing silicon material, and the etch stop layer 32 is spaced from the hard mask 34 by another separate layer 31 in the interlayer dielectric layer 30 that has a materially different etch rate in nitride etchants than the etch stop layer 32, such as an oxide. The etch stop layer 32 may be thinner than the hard mask 34 to enable eventual etching through the etch stop layer 32 without completely removing the hard mask 34. Etching the interlayer dielectric layer 30 through the pattern 36 in the hard mask 34 may be conducted in the same manner as described above in the context of FIG. 1 for etching the protecting layer 26 and the dielectric layer 28 that is immediately beneath the protecting layer 26 for purposes of forming via holes 23 during formation of the through-semiconductor via 22. However, it is to be appreciated that suitable integration schemes are not limited to the preceding examples.

A first interconnect via 42 and a second interconnect via 43 are embedded within the interlayer dielectric layer 30 to establish an electrical connection to the through-semiconductor via 22, as shown in FIG. 5. In an embodiment and as shown in FIG. 4, to form the first interconnect via 42 and the second interconnect via 43, a first interconnect hole 44 and a second interconnect hole 45 are etched through the interlayer dielectric layer 30 in the pattern 36 to expose a surface 46 of the through-semiconductor via 22 in the first interconnect hole 44 and the second interconnect hole 45. In the embodiment shown in FIG. 4, the first interconnect hole 44 and the second interconnect hole 45 are formed by patterning the etch stop layer 32 in portions of the etch stop layer 32 that are exposed in the pattern 36 and that overlie the through-semiconductor via 22, followed by etching through any remaining separate layers 33 of the interlayer dielectric layer 30 that are beneath the etch stop layer 32 to expose the surface 46 of the through-semiconductor via 22. Alternatively, although not shown, gaps in a configuration of the first interconnect hole 44 and the second interconnect hole 45 may be pre-patterned in the etch stop layer 32 prior to forming subsequent separate layers 31 of the interlayer dielectric layer 30 over the etch stop layer 32. In this embodiment, during etching of the interlayer dielectric layer 30 through the pattern 36 in the hard mask 34, etching may propagate through the gaps in the etch stop layer 32 that are exposed in the pattern 36 to effectively provide for interconnect hole formation concurrently with etching of the pattern 36 in the interlayer dielectric layer 30. However, it is to be appreciated that suitable integration schemes are not limited to the preceding examples.

The first interconnect via 42 and the second interconnect via 43 are in electrical communication with one of the through-semiconductor via 22 at spaced locations from each other on the through-semiconductor via 22. In an embodiment and as shown in FIG. 5, the first interconnect via 42 and the second interconnect via 43 are embedded within the interlayer dielectric layer 30 for each of the through-semiconductor vias 22. Dielectric material of the interlayer dielectric layer 30 separates the first interconnect via 42 from the second interconnect via 43 from direct physical contact. In this manner, an electrical connection between the first interconnect via 42 and the through-semiconductor via 22 can be established separate from an electrical connection between the second interconnect via 43 and the same through-semiconductor via 22, as shown in FIG. 5, which provides for numerous benefits including an ability to test for voiding between the through-semiconductor via 22 and either the interconnect vias 42, 43 or the interlayer dielectric layer 30, as described in further detail below. Further, by providing the first interconnect via 42 and the second interconnect via 43, less contact area between the interconnect vias 42, 43 and the through-semiconductor via 22 exists, which minimizes the incidence and impact of potential void formation on the respective electrical connections between the interconnect vias 42, 43 and the through-semiconductor via 22.

Figure 6:
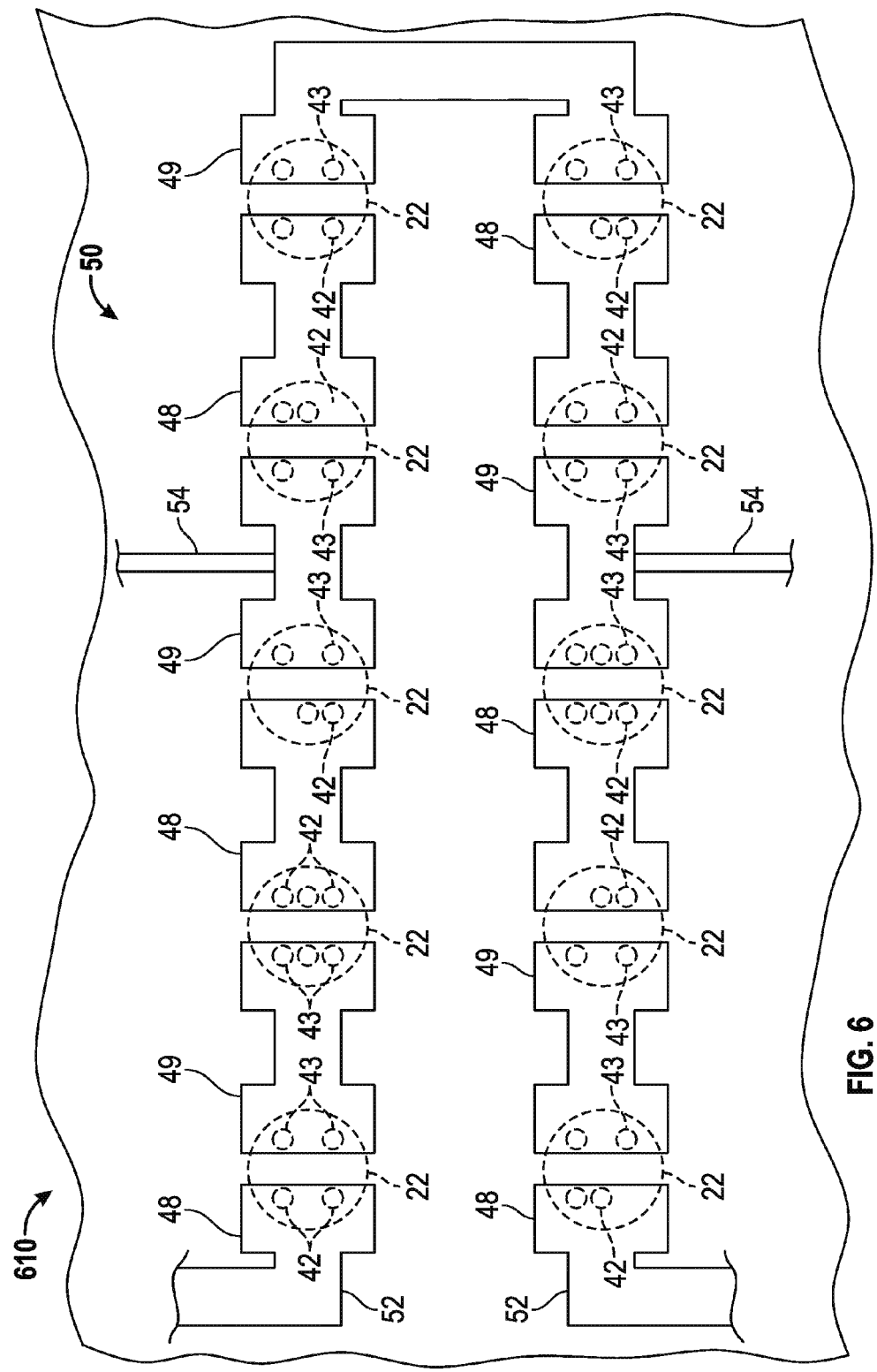
FIG. 6 is an expanded schematic top view of another embodiment of an integrated circuit after filling the pattern and the interconnect holes with electrically-conductive material to form a first metal layer and interconnect vias, respectively.

In embodiments, a plurality of first interconnect vias 42 and a plurality of second interconnect vias 43 are embedded within the interlayer dielectric layer 30 with dielectric material of the interlayer dielectric layer 30 separating each interconnect via 42, 43 from direct physical contact with each other. In an embodiment of the integrated circuit 610, as illustrated in FIG. 6, the plurality of first interconnect vias 42 is in electrical communication with one of the plurality of through-semiconductor vias 22, i.e., each through-semiconductor via 22 may have a plurality of first interconnect vias 42 associated therewith. Likewise, in this embodiment, the plurality of second interconnect vias 43 is in electrical communication with one of the plurality of through-semiconductor vias 22, such as the same through-semiconductor via 22 with which the plurality of first interconnect vias 42 is in electrical communication. By providing the plurality of first interconnect vias 42 and the plurality of second interconnect vias 43 associated with each of the through-semiconductor vias 22, robust electrical connection to the through-semiconductor vias 22 is assured and incidence of device failure attributable to incomplete connection of one or more individual interconnect vias 42, 43 to the corresponding through-semiconductor via 22 is minimized. In an embodiment of the integrated circuit 610 and as shown in FIG. 6, the plurality of first interconnect vias 42 and the plurality of second interconnect vias 43 are embedded in different configurations over different through-semiconductor vias 22, which enables different possible locations of voids to be detected and/or marginalized over different through-semiconductor vias 22.

In an embodiment and as shown in FIG. 5, a first electrically-conductive line 48 is formed that overlies and is in electrical communication with the first interconnect via 42. The first electrically-conductive line 48 is separated from direct physical contact with the second interconnect via 43 by dielectric material of the interlayer dielectric layer 30 so that the first electrically-conductive line 48 is only in physical contact with the first interconnect via 42. In an embodiment and as also shown in FIG. 5, a second electrically-conductive line 49 is also formed overlying and in electrical communication with the second interconnect via 43, with the second electrically-conductive line 49 separated from direct physical contact with the first interconnect via 42 by dielectric material of the interlayer dielectric layer 30. In this manner, an electrical circuit is formed between the first electrically-conductive line 48 and the second electrically-conductive line 49, through the first interconnect via 42, the through-semiconductor via 22, and the second interconnect via 43. In an embodiment and as shown in FIG. 6, an array 50 of first electrically-conductive lines 48 and second electrically-conductive lines 49 are formed. In particular, in the array 50, the first electrically-conductive lines 48 overlie and are in electrical communication with the plurality of first interconnect vias 42 that is associated with adjacent through-semiconductor vias 22, and the second electrically-conductive lines 49 overlie and are in electrical communication with the plurality of second interconnect vias 43 that is associated with adjacent through-semiconductor vias 22, with a plurality of through-semiconductor vias 22 in electrical communication through the array 50 of first electrically-conductive lines 48 and second electrically-conductive lines 49. In this manner, a "daisy chain" of connected through-semiconductor vias 22 is formed. In an embodiment and as shown in FIG. 6, an electrical end terminal 52 is formed that is associated with end electrically-conductive lines at ends of the array 50, with FIG. 6 showing two electrical end terminals 52 formed at ends of the array 50. In addition to or as an alternative to forming the electrical end terminals 52, and as shown in FIG. 6, an electrical internal terminal 54 may be formed that is associated with internal electrically-conductive lines that are internal within the array 50. In this manner, specific through-semiconductor vias 22 can be isolated for either testing or operation by supplying electricity through the electrical end terminals 52 or electrical internal terminals 54.

In an embodiment, to form the first electrically-conductive line 48 and the second electrically-conductive line 49, a metal-containing material is deposited in the pattern 36. The first electrically-conductive line 48 and the second electrically-conductive line 49, as referred to herein, are the layers formed after filling the pattern 36 with the metal-containing material, as distinguished from the interconnect vias 42, 43 that establish electrical communication between the through-semiconductor via 22 and the electrically-conductive lines 48, 49. The metal-containing material includes, but is not limited to, metals such as copper, tungsten, aluminum, silver, gold, or alloys thereof, and it is to be appreciated that components other than metals may be present in the metal-containing material provided that the first electrically-conductive line 48 and the second electrically-conductive line 49 are capable conducting electricity. In an embodiment, the first interconnect via 42 and the second interconnect via 43 are embedded in the interlayer dielectric layer 30 by concurrently filling the interconnect holes along with depositing the metal-containing material in the pattern 36. In this manner, robust connection between the electrically-conductive lines 48, 49 and the respective interconnect vias 42, 43 is possible, although it is to be appreciated that, in other embodiments, the first interconnect via 42 and/or the second interconnect via 43 may be formed prior to forming the first electrically-conductive line 48 and the second electrically-conductive line 49.

Although not shown in the figures, it is to be appreciated that additional interlayer dielectric layers and additional metal layers may be formed over the first electrically-conductive line 48 and the second electrically-conductive line 49 in accordance with known fabrication techniques for integrated circuits. It is also to be appreciated that additional structure may be present below the semiconductor substrate 14 shown in FIGS. 1-5, although no such additional structures are shown. Furthermore, numerous repeating structures as shown in FIGS. 1-5 can be stacked in the integrated circuit 10 to establish electrical connections through the through-semiconductor vias 22.

As alluded to above, the features of the integrated circuits 10 described herein enable testing to be conducted for voiding between the through-semiconductor via 22 and either the interconnect vias 42, 43 or interlayer dielectric layer 30. In an embodiment, a method of sensing voiding between the through-semiconductor via and a subsequent layer that overlies the through-semiconductor via in the integrated circuit 10 is provided. In this embodiment, an integrated circuit 10 is provided as described above. An electrical current is passed through the electrical connection between the first interconnect via 42 and the second interconnect via 43, through the through-semiconductor via 22. In an embodiment of the method using the integrated circuit 610 as shown in FIG. 6, the electrical current is passed through the electrical connections between the first interconnect via 42 and the second interconnect via 43, through the through-semiconductor vias 22, for a plurality of through-semiconductor vias 22 in series, such as when the array 50 of first electrically-conductive lines 48 and second electrically-conductive lines 49 are formed. However, it is to be appreciated that, when the electrical internal terminals 54 are formed, electrical current can be passed through the first interconnect via 42 and the second interconnect via 43 that are associated with a single through-semiconductor via 22. Electrical resistance to passage of the electrical current is then measured in the electrical connection between the first interconnect via 42 and the second interconnect via 43, with the measurements associated with single through-semiconductor vias 22 or sections of through-semiconductor vias 22 depending upon which electrical end terminals 52 or electrical internal terminals 54 are used. In this regard, electrical resistance may be measured in electrical connections between the electrically-conductive lines 48, 49, through the through-semiconductor vias 22, at a plurality of locations in the array 50. Based upon the measurements of electrical resistance, determinations can be made as to whether the first interconnect via 42 and the second interconnect via 43 provide an acceptable electrical connection with the corresponding through-semiconductor via 22. In an embodiment, the measured electrical resistance is compared to a benchmark electrical resistance value for the electrical connection between the first interconnect via 42 and the second interconnect via 43, through the through-semiconductor via 22. Based upon such comparison, determinations can be made as to whether the integrated circuits 10 are acceptable or whether modifications to fabrication of the integrated circuits 10, 610 are necessary.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming an integrated circuit, the method comprising:
    forming a plurality of semiconductor devices on a semiconductor substrate;
    forming a plurality of through-semiconductor vias in the semiconductor substrate;
    forming an interlayer dielectric layer overlying the through-semiconductor via and the plurality of semiconductor devices;
    embedding a first interconnect via within the interlayer dielectric layer, and a second interconnect via within the interlayer dielectric layer, wherein the first interconnect via and the second interconnect via are embedded within the interlayer dielectric layer for each of the through-semiconductor vias, the first interconnect via and the second interconnect via in electrical communication with the respective through-semiconductor via at spaced locations from each other on the through-semiconductor via; and
    forming an array of first electrically-conductive lines overlying and in electrical communication with the first interconnect via associated with adjacent through-semiconductor vias and second electrically-conductive lines overlying and in electrical communication with the second interconnect via associated with adjacent through-semiconductor vias, wherein the second electrically-conductive line is separated from direct physical contact with the first interconnect via by dielectric material of the interlayer dielectric layer with the plurality of through-semiconductor vias in electrical communication with each other through the array of first electrically-conductive lines and second electrically-conductive lines.

2. The method of claim 1, wherein embedding the first interconnect via comprises embedding a plurality of the first interconnect vias within the interlayer dielectric layer with dielectric material of the interlayer dielectric layer separating each first interconnect via from direct physical contact with each other.

3. The method of claim 2, wherein embedding the second interconnect via comprises embedding a plurality of the second interconnect vias within the interlayer dielectric layer with the dielectric material of the interlayer dielectric layer separating each second interconnect via from direct physical contact with each other.

4. The method of claim 1, wherein forming the through-semiconductor via comprises etching a via hole into the semiconductor substrate with the semiconductor substrate surrounding the at least one via hole, with the at least one semiconductor device formed adjacent the at least one via hole, and wherein the through-semiconductor via is formed in the via hole in the semiconductor substrate.

5. The method of claim 1, wherein embedding the first interconnect via and the second interconnect via within the interlayer dielectric layer for each of the through-semiconductor vias comprises embedding the first interconnect via and the second interconnect via in different configurations over different through-semiconductor vias.

6. The method of claim 1, further comprising forming an electrical end terminal associated with end electrically-conductive lines at ends of the array of electrically-conductive lines.

7. The method of claim 6, further comprising forming an electrical internal terminal associated with internal electrically-conductive lines that are internal within the array of electrically-conductive lines.

8. An integrated circuit comprising:
    a semiconductor substrate;
    a plurality of semiconductor devices disposed on the semiconductor substrate, a plurality of through-semiconductor vias disposed in the semiconductor substrate, an interlayer dielectric layer overlying the through-semiconductor via and the plurality of semiconductor devices;
    a first interconnect via embedded within the interlayer dielectric layer, and a second interconnect via within the interlayer dielectric layer, wherein first interconnect vias and second interconnect vias are embedded in the interlayer dielectric layer for each through semiconductor via, the first interconnect via and the second interconnect via in electrical communication with the respective through-semiconductor via at spaced locations from each other on the through-semiconductor via; and
    an array of first electrically-conductive lines overlying and in electrical communication with the first interconnect via associated with adjacent through-semiconductor vias and second electrically-conductive lines overlying and in electrical communication with the second interconnect via associated with adjacent through-semiconductor vias, wherein the second electrically-conductive line is separated from direct physical contact with the first interconnect via by dielectric material of the interlayer dielectric layer with the plurality of through-semiconductor vias in electrical communication with each other through the array of first electrically-conductive lines and second electrically-conductive lines.

* * * * *